United States Patent
Zhao et al.

(10) Patent No.: US 10,705,251 B1
(45) Date of Patent: Jul. 7, 2020

(54) FAULT MODELING IN LOW ORDER CONTINUOUS SCALE SIMULATION

(71) Applicant: Tachyus Corporation, San Mateo, CA (US)

(72) Inventors: Yong Zhao, Katy, TX (US); Pallav Sarma, Danville, CA (US)

(73) Assignee: Tachyus Corporation, San Mateo, CA (US)

( * ) Notice: Subject to any disclaimer, the term of this patent is extended or adjusted under 35 U.S.C. 154(b) by 759 days.

(21) Appl. No.: 15/466,852

(22) Filed: Mar. 22, 2017

(51) Int. Cl.
*G06G 7/48* (2006.01)
*G01V 99/00* (2009.01)
*G06N 3/08* (2006.01)
*G06F 30/20* (2020.01)

(52) U.S. Cl.
CPC ............ *G01V 99/005* (2013.01); *G06F 30/20* (2020.01); *G06N 3/08* (2013.01)

(58) Field of Classification Search
CPC .......... G01V 99/005; G06F 30/20; G06N 3/08
USPC ................................................ 706/25; 703/10
See application file for complete search history.

(56) References Cited

U.S. PATENT DOCUMENTS

| | | | |
|---|---|---|---|
| 2013/0118736 A1* | 5/2013 | Usadi | G06N 3/0427 166/268 |
| 2013/0218538 A1* | 8/2013 | Fuecker | G06F 30/23 703/2 |
| 2013/0246031 A1* | 9/2013 | Wu | G06T 17/05 703/10 |

* cited by examiner

*Primary Examiner* — Andre Pierre Louis
(74) *Attorney, Agent, or Firm* — Patent Law Offices of Michael E. Woods; Michael E. Woods

(57) ABSTRACT

A system and method for characterizing subsurface hydrocarbon reservoirs, such as through fault modeling in low order continuous scale simulation of real world subsurface hydrocarbon reservoirs having discontinuities and improving an accuracy and speed of the characterizations.

2 Claims, 5 Drawing Sheets

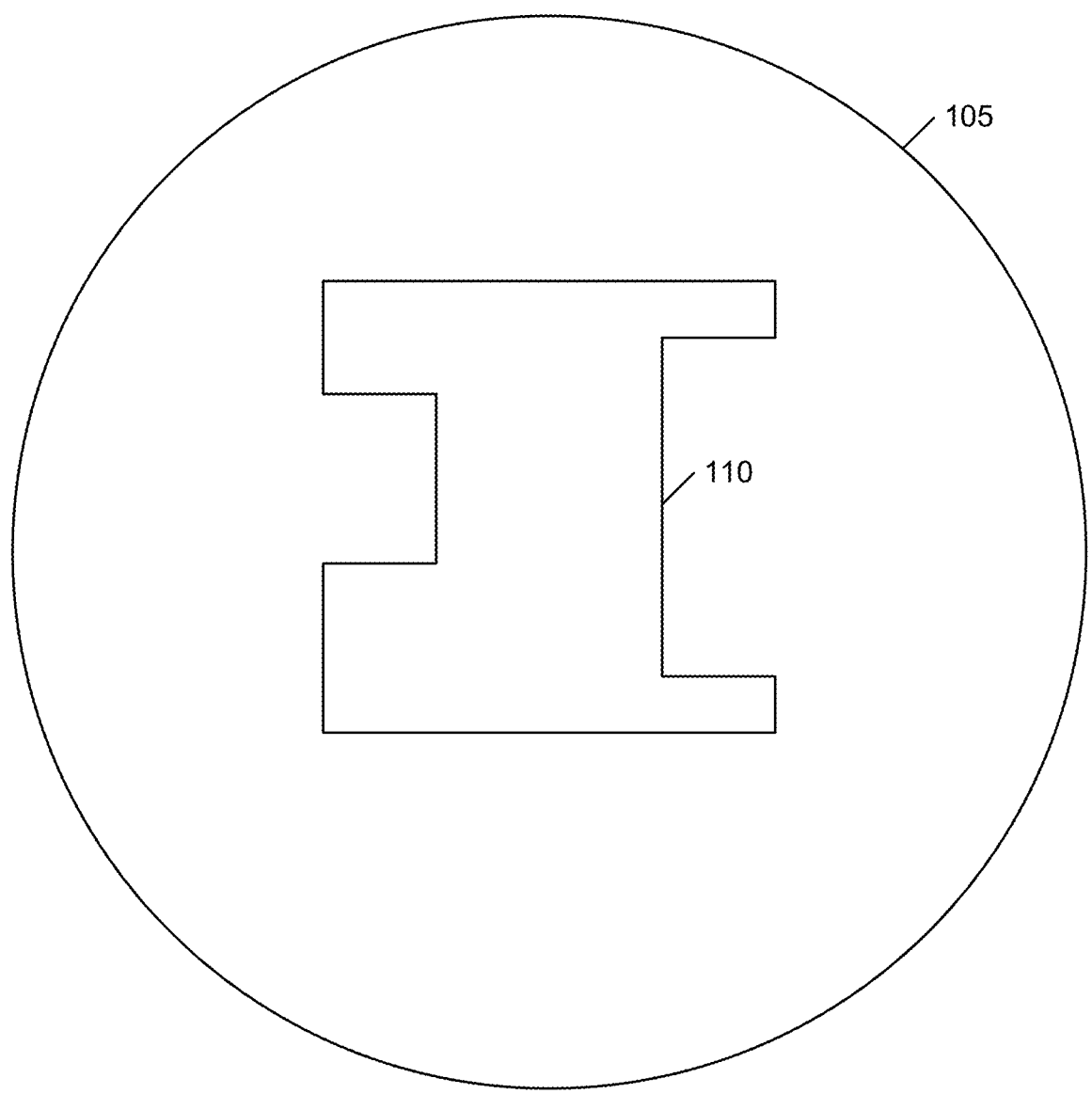
FIG_01

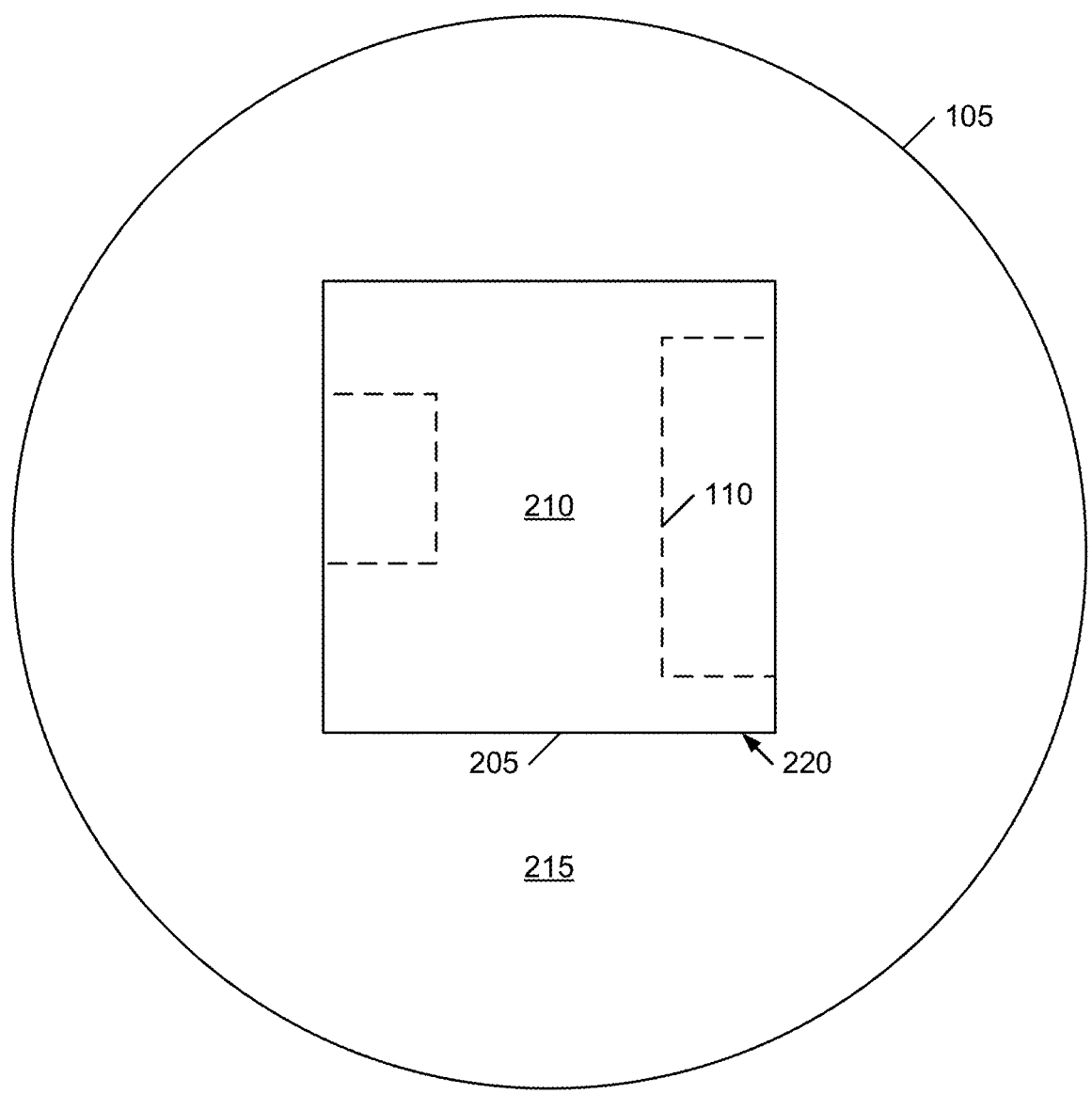
FIG_02

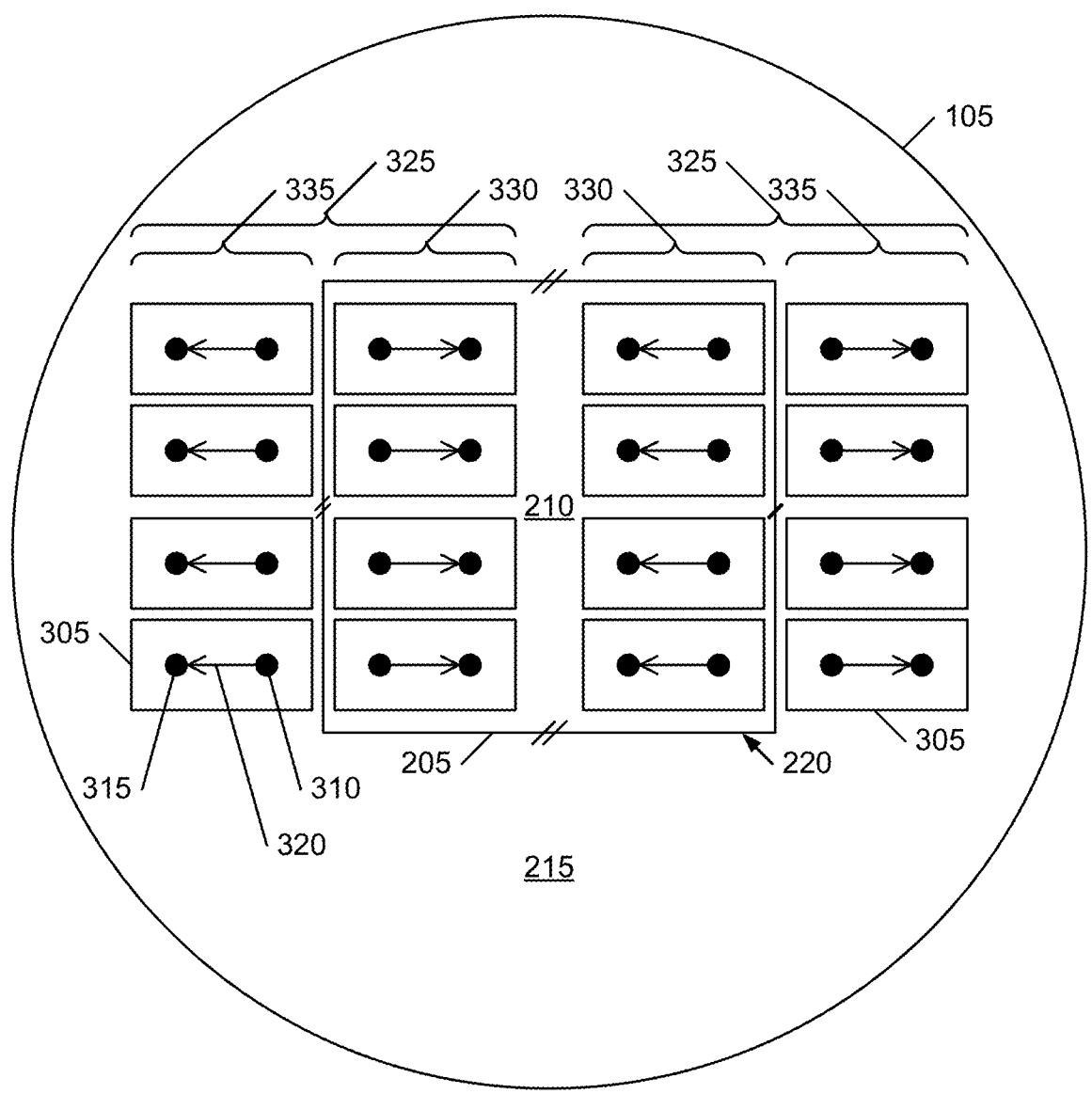
FIG_03

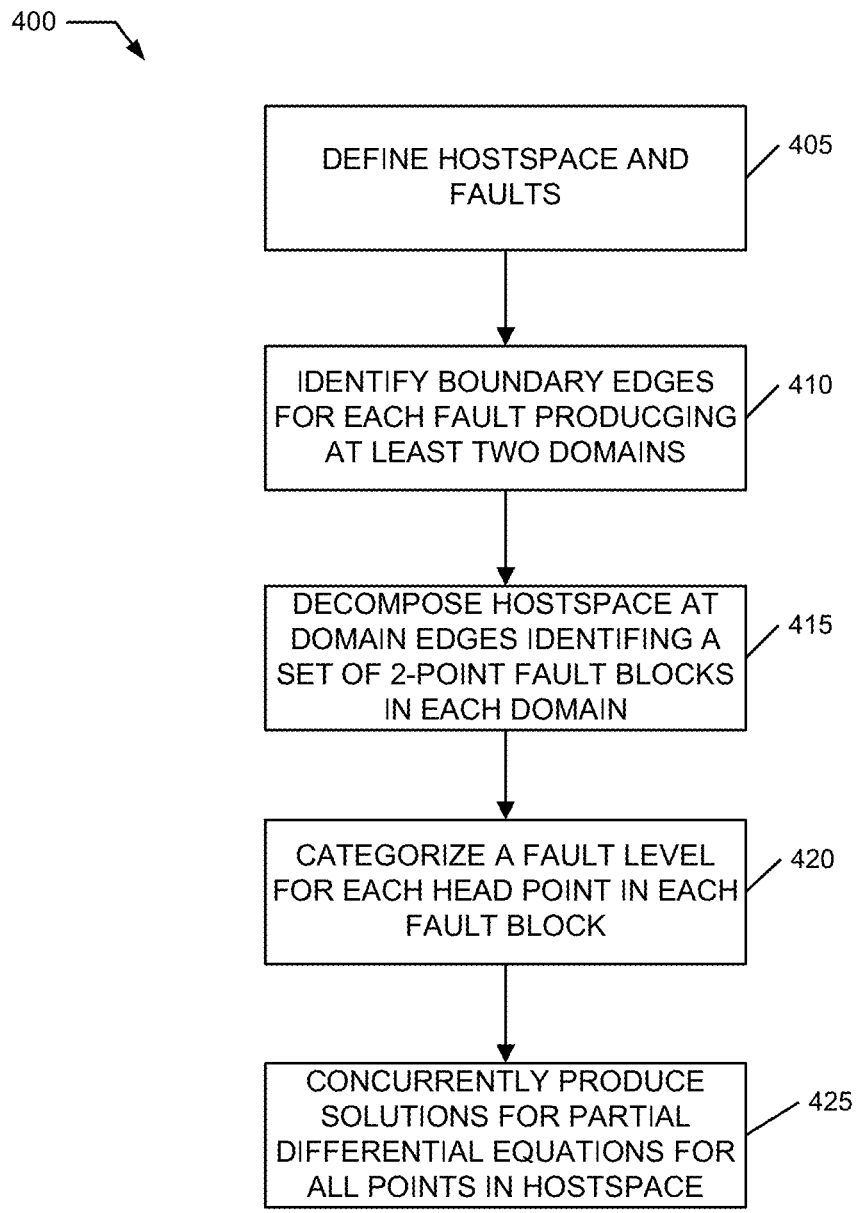
FIG_04

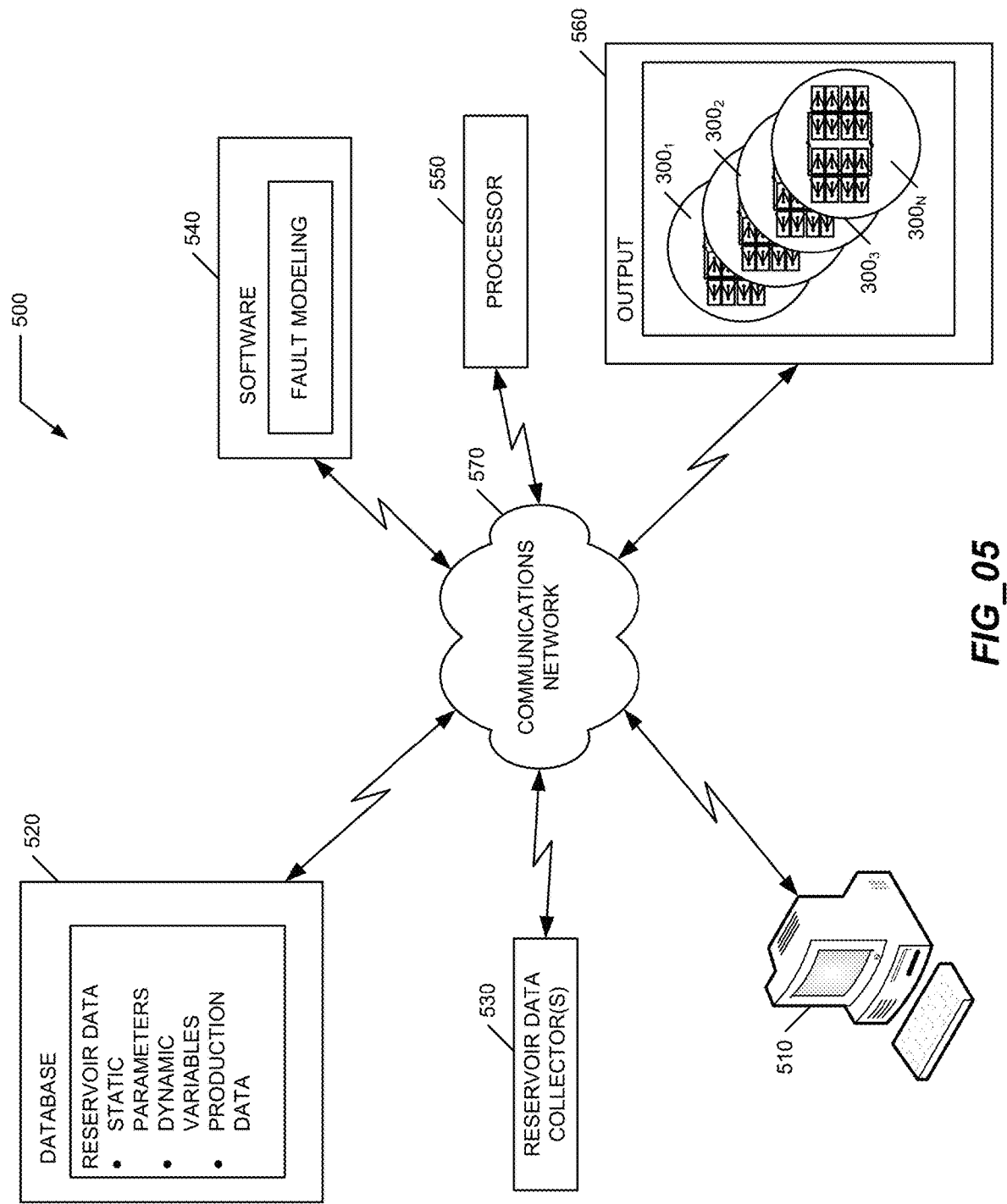
FIG_05

US 10,705,251 B1

FAULT MODELING IN LOW ORDER CONTINUOUS SCALE SIMULATION

FIELD OF THE INVENTION

The present invention relates generally to petrochemical reservoir characterization, and more specifically, but not exclusively, to fault modeling in low order continuous scale simulation of subsurface hydrocarbon reservoirs.

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Subsurface hydrocarbon reservoirs may represent 100's of millions to many billions of dollars of fluid, such as oil and natural gas. Due to this value, it is important to characterize petrochemical fluid dynamics to the greatest degree possible, which will help understand the present and future value of the reservoir and how to optimize management of related oil and gas fields accessing these subsurface hydrocarbon reservoirs.

One way to model a subsurface hydrocarbon reservoir is to define a set of ordinary and partial differential equations modeling petrochemical fluid dynamics. There is a field of endeavor for defining and solving these equations in a host space using an artificial neural network. Unfortunately, these networks have limitations when the host space includes one or more discontinuities.

While techniques to model solutions of partial differential equations with neural networks have been recently developed, robust approaches to handle Neumann boundary conditions do not exist. It is critical to handle such boundary conditions to model no flow boundaries in reservoir simulation such as faults and pinch-outs. Such boundaries create discontinuities in the states of the system, thereby making it difficult to represent with smooth functions such as neural networks. Non-neighborhood connection (NNC) approach has been generally accepted as the solution to solve this problem for reservoir simulation based on finite volume meshes. However, such approaches are not applicable to meshless methods as above are the concept of connections is not defined.

When the host space represents a subsurface hydrocarbon reservoir, there may be physical discontinuities. For example, some of the applicable partial differential equations may relate to fluid flow in the reservoir. Within the reservoir, there may be physical structures that wholly or partially block fluid flow at various locations. While a position and orientation of these physical structures may be known or estimated from seismic data, a straightforward application of a neural network will fail at boundaries of these physical structures.

It may be advantageous to provide a system or method for characterizing subsurface hydrocarbon reservoirs, such as through fault modeling in low order continuous scale simulation of real world subsurface hydrocarbon reservoirs having discontinuities and improving an accuracy and speed of the characterizations.

BRIEF SUMMARY OF THE INVENTION

Disclosed is a system and method for characterizing subsurface hydrocarbon reservoirs, such as through fault modeling in low order continuous scale simulation of real world subsurface hydrocarbon reservoirs having discontinuities and improving an accuracy and speed of the characterizations. The following summary of the invention is provided to facilitate an understanding of some technical features related to machine-implemented fault modeling of subsurface oil and gas reservoirs, and is not intended to be a full description of the present invention. A full appreciation of the various aspects of the invention can be gained by taking the entire specification, claims, drawings, and abstract as a whole. The present invention is applicable to other subsurface fluids in addition to oil and gas, and may be applicable to other neural network solutions to Neumann boundary conditions having a set of linking differential equations.

An embodiment of the present invention may include a mixed domain decomposition method for comprehensive modeling of connected fault vectors, which allows modeling flows with open, partially open and closed faults; and a dual point scheme based no flow boundary, which enforces the first and second pressure derivative in normal direction.

A computer-implemented method for fault modeling in low order continuous scale simulation of a subsurface hydrocarbon reservoir executing, by at least one processor, instructions recorded on a non-transitory computer-readable storage medium, the method including a) defining, using the at least one processor, a hostspace including the subsurface hydrocarbon reservoir and a set of faults producing a Neumann boundary condition for a neural network solution to a set of equations, the set of equations having a first subset of partial differential equations including first and second order pressure derivatives and further having a second subset of partial differential equations including thermal flow derivatives, and wherein the hostspace defines a first domain; b) identifying, using the at least one processor, a set of boundary edges within the hostspace with one boundary edge for each the fault of the set of faults, each the boundary edge producing an additional domain distinct from the first domain; c) decomposing, using the at least one processor, the hostspace into a plurality of fault vectors referenced to the set of boundary edges, each the fault vector including a head point located in a particular one of the domains at a particular portion of a particular boundary edge, a tail point spaced away from the head point and extending orthogonally away from the particular portion of the particular boundary edge in the particular one domain, wherein each the head point in the particular one domain is associated with another head point in another particular one domain, and wherein each the point of each the fault vector is associated with equations from the first and second subsets of partial differential equations; d) identifying, using the at least one processor, a set of head points having the Neumann boundary condition wherein a no-flow condition is defined for corresponding head points having the Neumann boundary condition and wherein a thermal flow condition is defined between corresponding head points having the Neumann boundary condition; and e) producing, using the at least one processor, a neural network solution to the hostspace using the set of fault vectors.

A non-transitory computer-readable medium for fault modeling in low order continuous scale simulation of a subsurface hydrocarbon reservoir, including instructions stored thereon, that when executed on at least one processor, perform the steps of a) defining, using the at least one processor, a hostspace including the subsurface hydrocarbon reservoir and a set of faults producing a Neumann boundary condition for a neural network solution to a set of equations, the set of equations having a first subset of partial differential equations including first and second order pressure derivatives and further having a second subset of partial differential equations including thermal flow derivatives, and wherein the hostspace defines a first domain; b) identifying, using the at least one processor, a set of boundary edges within the hostspace with one boundary edge for each the fault of the set of faults, each the boundary edge producing an additional domain distinct from the first domain; c) decomposing, using the at least one processor, the hostspace into a plurality of fault vectors referenced to the set of boundary edges, each the fault vector including a head point located in a particular one of the domains at a particular portion of a particular boundary edge, a tail point spaced away from the head point and extending orthogonally away from the particular portion of the particular boundary edge in the particular one domain, wherein each the head point in the particular one domain is associated with another head point in another particular one domain, and wherein each the point of each the fault vector is associated with equations from the first and second subsets of partial differential equations; d) identifying, using the at least one processor, a set of head points having the Neumann boundary condition wherein a no-flow condition is defined for corresponding head points having the Neumann boundary condition and wherein a thermal flow condition is defined between corresponding head points having the Neumann boundary condition; and e) producing, using the at least one processor, a neural network solution to the hostspace using the set of fault vectors.

Any of the embodiments described herein may be used alone or together with one another in any combination. Inventions encompassed within this specification may also include embodiments that are only partially mentioned or alluded to or are not mentioned or alluded to at all in this brief summary or in the abstract. Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 1 illustrates a subsurface hydrocarbon reservoir including a fault;

FIG. 2 illustrates a definition of a domain boundary around the fault illustrated in FIG. 1;

FIG. 3 illustrates decomposition of a host space of the reservoir into fault vectors referenced to edges of the domain boundary;

FIG. 4 illustrates a process for fault modeling in low order continuous scale simulation of a subsurface hydrocarbon reservoir; and FIG. 5 illustrates a system for characterizing subsurface hydrocarbon reservoirs, such as through fault modeling in low order continuous scale simulation of real world subsurface hydrocarbon reservoirs having discontinuities and improving an accuracy and speed of the characterizations using a computer-implemented method of FIG. 4.

DETAILED DESCRIPTION OF THE INVENTION

Embodiments of the present invention provide a system and method for characterizing subsurface hydrocarbon reservoirs, such as through fault modeling in low order continuous scale simulation of real world subsurface hydrocarbon reservoirs having discontinuities and improving an accuracy and speed of the characterizations. The following description is presented to enable one of ordinary skill in the art to make and use the invention and is provided in the context of a patent application and its requirements.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Definitions

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The following definitions apply to some of the aspects described with respect to some embodiments of the invention. These definitions may likewise be expanded upon herein.

As used herein, the term "or" includes "and/or" and the term "and/or" includes any and all combinations of one or more of the associated listed items. Expressions such as "at least one of," when preceding a list of elements, modify the entire list of elements and do not modify the individual elements of the list.

As used herein, the singular terms "a," "an," and "the" include plural referents unless the context clearly dictates otherwise. Thus, for example, reference to an object can include multiple objects unless the context clearly dictates otherwise.

Also, as used in the description herein and throughout the claims that follow, the meaning of "in" includes "in" and "on" unless the context clearly dictates otherwise. It will be understood that when an element is referred to as being "on" another element, it can be directly on the other element or intervening elements may be present therebetween. In contrast, when an element is referred to as being "directly on" another element, there are no intervening elements present.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common properties.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "connect," "connected," and "connecting" refer to a direct attachment or link. Connected objects have no or no substantial intermediary object or set of objects, as the context indicates.

As used herein, the terms "couple," "coupled," and "coupling" refer to an operational connection or linking. Coupled objects can be directly connected to one another or can be indirectly connected to one another, such as via an intermediary set of objects.

The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent of the given numeric value provided such a deviation does not alter the end function or result of the value. Therefore, a value of about 1% can be construed to be a range from 0.9% to 1.1%.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels or variability of the embodiments described herein.

As used herein, the terms "optional" and "optionally" mean that the subsequently described event or circumstance may or may not occur and that the description includes instances where the event or circumstance occurs and instances in which it does not.

A system, method, and computer program product for characterizing subsurface hydrocarbon reservoirs, such as through fault modeling in low order continuous scale simulation of real world subsurface hydrocarbon reservoirs having discontinuities and improving an accuracy and speed of the characterizations using a computer-implemented method. The system, method, and computer program product uses a mixed domain decomposition for comprehensive modeling of connected fault vectors allowing for neural network modeling with open, partially open, and closed faults. The fault vectors implement a dual-point scheme based no-flow boundary which enforces the first and second pressure derivative in normal direction.

Embodiments of this invention can be of significant utility for the oil and gas industry, where oil and gas companies' values are directly related to the quantity of resources and reserves owned and operated by each company and where multi-million to billion dollar decisions are made based on the petrophysical interpretation of well log data. This automated petrophysical method can be directly applied to traditional oil and gas industry workflows, including reservoir characterization, geologic modeling, reservoir simulation, and probabilistic resource and reserves quantification.

FIG. 1 illustrates a subsurface hydrocarbon reservoir 105 including a fault 110. Reservoir 105 is depicted as a two dimensional section to simplify the discussion of the present invention. It is understood that a real world reservoir 105 includes a three dimensional structure and that a size and shape varies for sections taken at different points. Sometimes this three dimensional structure may be defined as a fault block, a volume of rocks fully or partially isolated by a set of faults. For example, when reservoir 105 is represented as an overhead plan view, the section varies as depth changes. Reservoir 105, with fault 110, is greatly simplified from typical real world systems.

Reservoir 105 includes a quantity of oil and/or gas that may be easily modeled or simulated using a neural network in an absence of fault 110. However, fault 110 may create Neumann boundary conditions within reservoir that could negatively impact or degrade neural network solutions.

Desirably there are a set of physical parameters of reservoir 105 that are to be simulated. To simulate that set of physical parameters, a set of ordinary and partial differential equations, of varying order, may be employed. For example, a neural network system may be employed to solve these equations which allows for an accurate simulation. For subsurface hydrocarbon reservoir simulation, that set of equations may include first and second order partial differential equations for fluid and thermal flow.

Some of these included partial differential equations may be adversely affected at a boundary 115 between reservoir 105 and fault 110. For example, a first subset of these equations may include a first and second pressure or flow derivative in a direction normal to an edge of the boundary. A second subset of these equations may include partial differential equations that are not adversely affected at boundary 115. For example, the second subset may include a first or second thermal flow derivative. Some embodiments of the present invention include both subsets of equations.

However, the existence of fault 110 and boundary 115 negatively impact an ability of a neural network to find a solution to all of these equations for the entirety of reservoir 105.

Fault 110 represents a physical structure within reservoir 105 that includes an aggregated set of potential discontinuities. This aggregated set of potential discontinuities could create localized fault boundaries within reservoir 105 and degrade solution by the neural network. Seismic procedures and the like, may be used to locate and define these faults. In some cases, additional faults may be inferred or defined based on other data in addition to, or in lieu of, seismic data.

At varying points along fault 110, there may be various flow possibilities, including unrestricted flow, partially restricted flow, and no-flow. Of particular concern are those no-flow points which create Neumann boundary conditions and interfere with continuous mesh solutions for reservoir 105 using the neural network.

FIG. 2 illustrates a definition of a domain boundary 205 around fault 110 within reservoir 105. Domain boundary 205 defines a first domain 210 and a second domain 215 within a host space of reservoir 105. The demarcation of boundary 205 between first domain 210 and second domain 215 is a perimeter edge 220.

FIG. 3 illustrates decomposition of the host space of reservoir 105 into a set of fault vectors 305 referenced to edge 220 of boundary 205. At various points along edge 220, fault vectors 305 will be defined.

Each fault vector 305 includes a pair of points including a head point 310 and a spaced apart tail point 315 defining a head-to-tail vector 320. For each fault vector 305, head point 310 is located within a domain right at edge 220, with vector 320 normal to edge 220. Particulars of decomposing each domain using fault vectors 305 may vary based upon different design goals, for purposes of explanation, vector 320 of fault vector 305 has a length of about five feet.

After decomposition, each fault vector 305 within first domain 210 has a corresponding fault vector 305 within second domain 215. Collectively, a set of associated fault vectors 325 includes a first set of fault vectors 330 of first domain 210 that correspond with a second set of fault vectors 335 of second domain 215.

Head points 310 of corresponding fault vectors 305 are essentially located at the same physical location, Tail points 305 of corresponding fault vectors 305 of first set of fault vectors 330 are each spaced directly away from edge 220 and directly from tail points 305 of corresponding fault vectors 305 of second set of fault vectors 335.

Each point of each fault vector 305 of reservoir 105 includes a set of equations, including the partial differential equations discussed herein. Additionally, each point of each fault vector 305 has a fault level including flow, partial flow, and no-flow based upon physical attributes of edge 220 at the position of each head point 310 of each fault vector 305.

Fault levels of head points 310 of fault vectors 305 in first set of fault vectors 330 match fault levels of head points 310 of corresponding fault vectors 305 in second set of fault vector 335. That is, when head point 310 of a particular fault vector $305_i$ of first set of fault vectors 330 has a no-flow state, head point 310 of a particular domain $305_i$ of second set of fault vectors 335, corresponding to the particular fault vector $305_i$ of first set of fault vectors 330, has the exact same fault level, in this case, the no-flow state. Of particular importance are head points 310 having no-flow states as they represent Neumann boundary conditions for reservoir 105. In some instances, at particular set of vectors around edge 220, the fault level could be set as open boundary, and hence, the potential values are set as equal at those corresponding head points 310 so that the particular section allows flow transport across the edge.

In addition to knowing solutions to the pressure differentials between corresponding fault vectors 305, heat flow may also modeled across edge 220 because temperature and temperature gradients for all head points 310 of particular corresponding fault vectors 305 along edge 220 are set to be equal to the head point 310 of the corresponding fault vector 305 in the other domain.

In this way, with these constraints on the pair of points of each fault vector 305, it is possible to solve all the equations of the set of equations using a neural network due to enforcement FIG. 4 illustrates a process 400 for fault modeling in low order continuous scale simulation of reservoir 105. Process 400 has a set of steps which may include steps 405-430. Process 400 may be a machine-implemented method to solve a set of equations using a neural network that may be used to simulate subsurface hydrocarbons of an oil or gas reservoir. That reservoir may include one or more geological faults that could interfere with production of the solutions using the neural network. Process 400 decomposes the hostspace into special fault blocks and vectors to enable use of the neural network to produce solutions to the equations for the entire hostspace, including the faults.

A step 405 includes defining a hostspace (e.g., some or all of a particular subsurface hydrocarbon reservoir) and a set of faults included within that hostspace. This information may be retrieved from a datastore, such as a database.

After step 405, process 400 performs a step 410 which identifies or defines a set of closed boundary edges, one closed boundary edge for each fault. The hostspace defines one domain, and an inside of each closed boundary edge defines another domain. Closed boundary edges are not stacked, or defined within, another closed boundary edge. That is, each closed boundary edge has the hostspace domain on one side (e.g., an outside) and another domain on another side (e.g., an inside).

After step 410, process 400 performs a step 415 which discretizes the hostspace into fault vectors as described herein, for example such as provided in the discussion associated with FIG. 3. Each fault vector is wholly located within a single domain and includes a head point and a tail point spaced apart from the head point. Each head point is located at a boundary edge with the associated spaced apart tail point extending in a direction that is normal to a portion of the edge proximate the associated tail point. Each fault vector inside a domain defined by a boundary edge has a corresponding fault vector within the domain of the hostspace. That corresponding fault vector in the hostspace domain also includes a heat point located at the edge (and essentially co-located at the location as the head point of the corresponding fault vector inside the domain defined by the boundary edge. Similarly, the tail point of the corresponding fault vector is spaced apart from its associated head point in a direction that is normal to that portion of the edge proximate the associated head point.

After step 415, process 400 performs a step 420 which categorizes a fault level of each head point within each fault vector. Possibilities for the fault level may include full flow, partial flow, or no flow. No flow is an important category as it can create a discontinuity in a mesh neural network system producing absent the treatment described herein. Each point of each fault vector has associated with it a set of equations, including a set of partial different equations. How those set of equations are solved depends upon the fault level of the point associated with the set of equations, among other parameters.

After step 420, process 400 performs a step 425 to produce a solution to the sets of equations of all the points of all the fault vectors associated with the hostspace. Those solutions may be produced concurrently or simultaneously using a neural network. This is possible because the decomposition as described has enforced the first and second pressure differential in a normal direction to the edge, including for the no-flow fault level.

The above described methods can be implemented in the general context of instructions executed by a stored program computer system coupled to a memory storing those instructions, including non-transitory storage systems. Such computer-executable instructions may include programs, routines, objects, components, data structures, and computer software technologies that can be used to perform particular tasks and process abstract data types. Software implementations of the above described methods may be coded in different languages for application in a variety of computing platforms and environments. It will be appreciated that the scope and underlying principles of the above described methods are not limited to any particular computer software technology.

Moreover, those skilled in the art will appreciate that the above described methods may be practiced using any one or a combination of computer processing system configurations, including, but not limited to, single and multi-processer systems, hand-held devices, programmable consumer electronics, mini-computers, or mainframe computers. The above described methods may also be practiced in distributed computing environments where tasks are performed by servers or other processing devices that are linked through a one or more data communications networks. In a distributed computing environment, program modules may be located in both local and remote computer storage media including memory storage devices.

Also, an article of manufacture for use with a computer processor, such as a CD, pre-recorded disk or other equivalent devices, could include a computer program storage medium and program means recorded thereon for directing the computer processor to facilitate the implementation and practice of the above described methods. Such devices and articles of manufacture also fall within the spirit and scope of the present invention.

As will be described, the invention can be implemented in numerous ways, including for example as a method (including a computer-implemented method), a system (including a computer processing system), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore are not to be considered limiting of its scope and breadth.

FIG. 5 illustrates a system 500 for characterizing subsurface hydrocarbon reservoirs, such as through fault modeling in low order continuous scale simulation of real world subsurface hydrocarbon reservoirs having discontinuities and improving an accuracy and speed of the characterizations using a computer-implemented method of FIG. 4.

System 500 may include a user interface 510, such that an operator can actively input information and review operations of system 500. User interface 510 can be any mechanism, structure, apparatus, machine, or article of manufacture in which a person is capable of interacting with system 500 and may include devices such as a keyboard, mouse, or touch-screen display. Operator-entered data input into system 500 through user interface 510, can be stored in a database 520. Reservoir field data, including for example, well pressure, oil production, water production, gas production, or seismic data, which is received by one or more reservoir data collectors 530 (e.g., oil field sensors), can also be input into system 500 for storage in database 520. Additionally, any information generated by system 500 can be stored in database 520.

Database 520 can store user-defined variables, equations, and parameters such as the pressure and thermal flow, mass and energy balance equations and associated fitting parameters, as well as, reservoir production data, and system generated computed solutions. For example, geological, petrophysical, and reservoir data, such as static variables (permeability fields, porosity fields), dynamic variables (pressure, saturation), and production data (production and injection rates, bottom-hole pressures), are all examples of information that can be stored in database 520.

System 500 includes a computer program product or software 540 that is stored on a non-transitory processor readable medium. Current examples of a processor readable medium include, but are not limited to, an electronic circuit, a semiconductor memory device, a ROM, a flash memory, an erasable programmable ROM (EPROM), a floppy diskette, a compact disk (CD-ROM), an optical disk, a hard disk, and a fiber optic medium. As will be described more fully herein, software 540 can include a plurality of modules for performing system tasks such as performing the methods previously described herein. A processor 550 interprets instructions to execute software 540, as well as, generates automatic instructions to execute software for system 500 responsive to predetermined conditions. Instructions from both user interface 510 and software 540 are processed by processor 550 for operation of system 500. In some embodiments, a plurality of processors can be utilized such that system operations can be executed more rapidly.

In certain embodiments, system 500 can include an optional reporting unit 560 to provide information to the operator or to other systems (not shown). For example, reporting unit 560 can include a printer, display screen, or a data storage device. However, it should be understood that system 500 need not include reporting unit 560, and alternatively user interface 510 can be utilized for reporting information of system 500 to the operator.

Communication between any components of system 500, such as user interface 510, database 520, reservoir data collectors 530, software 540, processor 550 and reporting unit 560, can be transferred over a communications network 570. Communications network 570 can be any mechanism that allows for information transfer. Examples of communications network 570 presently include, but are not limited to, a switch within a computer, a personal area network (PAN), a local area network (LAN), a wide area network (WAN), and a global area network (GAN). Communications network 570 can also include any hardware technology used to connect the individual devices in the network, such as an optical cable or wireless radio frequency.

In operation, an operator initiates software 540, through user interface 510, to perform the methods described herein. Outputs from software 540 can be stored in database 520. For example, software 540 can load a set of partial differential equations from database 5320, location(s) of fault(s), and any other relevant data, Software 540 may then execute method 400 to produce one or more outputs, such as output 500, (each representing a result of method 400 for a particular reservoir 105 for a particular set of data and faults at a particular point in time). A visual display can be produced, such as through reporting unit 560 or user interface 510, using the method of FIG. 4.

The system and methods above has been described in general terms as an aid to understanding details of preferred embodiments of the present invention. In the description herein, numerous specific details are provided, such as examples of components and/or methods, to provide a thorough understanding of embodiments of the present invention. Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Combinations of components or steps will also be considered as being noted, where terminology is foreseen as rendering the ability to separate or combine is unclear.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. A computer-implemented method for fault modeling in low order continuous scale simulation of a subsurface hydrocarbon reservoir executing, by at least one processor, instructions recorded on a non-transitory computer-readable storage medium, the method comprising:

a) defining, using the at least one processor, a hostspace including the subsurface hydrocarbon reservoir and a set of faults producing a Neumann boundary condition for a neural network solution to a set of equations, said set of equations having a first subset of partial differential equations including first and second order pressure derivatives and further having a second subset of partial differential equations including thermal flow derivatives, and wherein said hostspace defines a first domain;

b) identifying, using the at least one processor, a set of boundary edges within said hostspace with one boundary edge for each said fault of said set of faults, each said boundary edge producing an additional domain distinct from said first domain;

c) decomposing, using the at least one processor, said hostspace into a plurality of fault vectors referenced to said set of boundary edges, each said fault vector including a head point located in a particular one of said domains at a particular portion of a particular boundary edge, a tail point spaced away from said head point and extending orthogonally away from said particular portion of said particular boundary edge in said particular one domain, wherein each said head point in said particular one domain is associated with another head point in another particular one domain, and wherein each said point of each said fault vector is associated with equations from said first and second subsets of partial differential equations;

d) identifying, using the at least one processor, a set of head points having said Neumann boundary condition wherein a no-flow condition is defined for corresponding head points having said Neumann boundary condition and wherein a thermal flow condition is defined between corresponding head points having said Neumann boundary condition; and e) producing, using the at least one processor, a neural network solution to said hostspace using said set of fault vectors f) simulating hydrocarbon in the subsurface reservoir based on the produced neural network solution.

2. A non-transitory computer-readable medium for fault modeling in low order continuous scale simulation of a subsurface hydrocarbon reservoir, comprising instructions stored thereon, that when executed on at least one processor, perform the steps of:

a) defining, using the at least one processor, a hostspace including the subsurface hydrocarbon reservoir and a set of faults producing a Neumann boundary condition for a neural network solution to a set of equations, said set of equations having a first subset of partial differential equations including first and second order pressure derivatives and further having a second subset of partial differential equations including thermal flow derivatives, and wherein said hostspace defines a first domain;

b) identifying, using the at least one processor, a set of boundary edges within said hostspace with one boundary edge for each said fault of said set of faults, each said boundary edge producing an additional domain distinct from said first domain;

c) decomposing, using the at least one processor, said hostspace into a plurality of fault vectors referenced to said set of boundary edges, each said fault vector including a head point located in a particular one of said domains at a particular portion of a particular boundary edge, a tail point spaced away from said head point and extending orthogonally away from said particular portion of said particular boundary edge in said particular one domain, wherein each said head point in said particular one domain is associated with another head point in another particular one domain, and wherein each said point of each said fault vector is associated with equations from said first and second subsets of partial differential equations;

d) identifying, using the at least one processor, a set of head points having said Neumann boundary condition wherein a no-flow condition is defined for corresponding head points having said Neumann boundary condition and wherein a thermal flow condition is defined between corresponding head points having said Neumann boundary condition; and e) producing, using the at least one processor, a neural network solution to said hostspace using said set of fault vectors f) simulating hydrocarbon in the subsurface reservoir based on the produced neural network solution.

* * * * *